(12) United States Patent
Yoshimoto et al.

(10) Patent No.: US 11,225,548 B2
(45) Date of Patent: Jan. 18, 2022

(54) RESIN COMPOSITION, HEAT-CONDUCTIVE FLEXIBLE SHEET USING SAME, AND HEAT DISSIPATION STRUCTURE

(71) Applicant: NISSHINBO HOLDINGS INC., Tokyo (JP)

(72) Inventors: Mitsuhiko Yoshimoto, Chiba (JP); Takahiro Shimoyama, Chiba (JP); Mami Iizuka, Chiba (JP)

(73) Assignee: NISSHINBO HOLDINGS INC., Tokyo (JP)

( * ) Notice: Subject to any disclaimer, the term of this patent is extended or adjusted under 35 U.S.C. 154(b) by 387 days.

(21) Appl. No.: 16/327,196

(22) PCT Filed: Aug. 22, 2017

(86) PCT No.: PCT/JP2017/029893
§ 371 (c)(1),
(2) Date: Feb. 21, 2019

(87) PCT Pub. No.: WO2018/051740
PCT Pub. Date: Mar. 22, 2018

(65) Prior Publication Data
US 2020/0369823 A1 Nov. 26, 2020

(51) Int. Cl.
| | | |
|---|---|---|
| C08G 18/80 | (2006.01) | |
| C08G 18/10 | (2006.01) | |
| C08G 18/32 | (2006.01) | |
| C08G 18/42 | (2006.01) | |
| C08G 18/48 | (2006.01) | |
| C08G 18/62 | (2006.01) | |
| C08G 18/66 | (2006.01) | |
| C08G 18/73 | (2006.01) | |
| C08J 5/18 | (2006.01) | |
| C08K 3/22 | (2006.01) | |
| C08K 9/04 | (2006.01) | |
| F28F 21/06 | (2006.01) | |
| F28F 13/00 | (2006.01) | |
| H05K 7/20 | (2006.01) | |

(52) U.S. Cl.
CPC ......... *C08G 18/8029* (2013.01); *C08G 18/10* (2013.01); *C08G 18/3218* (2013.01); *C08G 18/4238* (2013.01); *C08G 18/4854* (2013.01); *C08G 18/6208* (2013.01); *C08G 18/6603* (2013.01); *C08G 18/73* (2013.01); *C08J 5/18* (2013.01); *C08K 3/22* (2013.01); *C08K 9/04* (2013.01); *F28F 21/06* (2013.01); *C08J 2375/04* (2013.01); *C08K 2003/222* (2013.01); *C08K 2201/001* (2013.01); *F28F 2013/001* (2013.01); *F28F 2255/02* (2013.01); *H05K 7/2039* (2013.01)

(58) Field of Classification Search
None
See application file for complete search history.

(56) References Cited

U.S. PATENT DOCUMENTS

| | | | |
|---|---|---|---|
| 3,066,997 A | 12/1962 | Neher et al. | |
| 6,432,541 B1 | 8/2002 | Gan | |
| 2008/0050552 A1* | 2/2008 | Ahn | C08F 4/00 428/98 |
| 2013/0263995 A1 | 10/2013 | Lutz et al. | |
| 2015/0001281 A1* | 1/2015 | Jialanella | C08G 18/8012 228/175 |
| 2016/0017192 A1 | 1/2016 | Lutz et al. | |
| 2017/0197397 A1 | 7/2017 | Jialanella et al. | |

FOREIGN PATENT DOCUMENTS

| | | |
|---|---|---|
| CN | 1333791 A | 1/2002 |
| CN | 1916097 A | 2/2007 |
| CN | 103180400 A | 6/2013 |
| CN | 104144959 A | 11/2014 |
| CN | 105280587 A | 1/2016 |

(Continued)

OTHER PUBLICATIONS

Chinese Office Action and Search Report for Chinese Application No. 201780055101.0, dated Oct. 28, 2020.
International Search Report issued in PCT/JP2017/029893 (PCT/ISA/210), dated Nov. 7, 2017.
Chinese Office Action and Search Report for Chinese Application No. 201780055101.0, dated Feb. 5, 2021.
Liu, Yi-jun "Handbook of Polyurethane Raw Materials and Additives," Chemical Industrial Press, 2005, 14 pages total, with an English translation.

*Primary Examiner* — Jeffrey D Washville
(74) *Attorney, Agent, or Firm* — Birch, Stewart, Kolasch & Birch, LLP

(57) ABSTRACT

There is provided a heat-conductive flexible sheet that is formed of a non-silicone material and excellent in flexibility as well as durability such as heat-aging resistance, hydrothermal resistance, and thermal shock resistance, and a heat dissipation structure using the same, as well as a resin composition that exhibits excellent handleability in the kneading step in producing a heat-conductive sheet and can be suitably used as a binder material for a heat-conductive flexible sheet. A resin composition comprising a blocked urethane prepolymer, a predetermined epoxy compound, and a curing catalyst, the blocked urethane prepolymer being a reaction product of an aliphatic diisocyanate compound and a hydrogenated polybutadiene polyol having a hydroxy group at each of both ends, wherein the reaction product has at an end thereof an isocyanate group blocked with an aromatic hydroxy compound; a heat-conductive flexible sheet formed of a cured product of a mixed composition comprising the same and a heat-conductive inorganic filler; and a heat dissipation structure using the same.

2 Claims, No Drawings

(56) References Cited

FOREIGN PATENT DOCUMENTS

| | | |
|---|---|---|
| EP | 0 307 666 A1 | 3/1989 |
| EP | 2 436 712 A1 | 4/2012 |
| JP | 54-95400 A | 7/1979 |
| JP | 2-238019 A | 9/1990 |
| JP | 4-246462 A | 9/1992 |
| JP | 4-255754 A | 9/1992 |
| JP | 4-264121 A | 9/1992 |
| JP | 7-268051 A | 10/1995 |
| JP | 10-279838 A | 10/1998 |
| JP | 11-60677 A | 3/1999 |
| JP | 2002-80617 A | 3/2002 |
| JP | 2009-13237 A | 1/2009 |
| JP | 2012-251089 A | 12/2012 |

\* cited by examiner

RESIN COMPOSITION, HEAT-CONDUCTIVE FLEXIBLE SHEET USING SAME, AND HEAT DISSIPATION STRUCTURE

TECHNICAL FIELD

The present invention relates to a resin composition that can be suitably used as a binder for a heat-conductive flexible sheet, and a heat-conductive flexible sheet using the same, as well as a heat dissipation structure.

BACKGROUND ART

Electronic members such as LEDs, CPUs, and power ICs used in electronic/electric devices involve large heat generation when using these devices. Such heat generation may interfere with normal operation of the devices and further may cause a failure or breakdown thereof. Therefore, heat generated from a heating element such as an electronic member described above is dissipated outward via a radiator such as a heatsink or a metal frame.

For this purpose, a sheet formed of an insulation material having high heat conductivity is sandwiched between the heating element and the radiator in order to enhance the dissipating effect, efficiently conducting heat from the heating element to the radiator. Such a sheet is generally called a heat dissipation sheet, a heat-conductive sheet, or the like.

The heat-conductive sheet is generally composed of a heat-conductive filler as a main component and a binder such as a resin or a rubber as a sub-component. For the heat-conductive sheet, required are the heat conductivity and the heat insulating property as a matter of course, and also the flexibility to provide good adhesion between the heating element and the radiator as well as long-term durability such as heat resistance (heat-aging resistance), hydrothermal resistance, and thermal shock resistance (resistance to hot-cold cycles).

Under such circumstances, silicone rubbers and silicone resins are widely used as a binder hitherto (see, for example, PTL 1).

A sheet using a flexible epoxy resin (PTL 2) or polyurethane (PTL 3) as a non-silicone material is proposed.

CITATION LIST

Patent Literature

PTL 1: JP2002-80617A
PTL 2: JP2012-251089A
PTL 3: JP2009-13237A

SUMMARY OF INVENTION

Technical Problem

When a silicone material such as a silicone rubber or a silicone resin is used as a binder, a heat-conductive sheet exhibiting excellent heat resistance at a temperature as high as around 150° C. can be obtained. However, siloxanes having a low molecular weight contained in the silicone material volatilize to adhere the contacting point of the electronic/electric device and decompose, resulting in the occurrence of a contact fault or a conduction failure thereof. This is problematic.

On the other hand, when an epoxy resin or polyurethane, which is a non-silicone material, is used as a binder, the problem caused by siloxanes having a low molecular weight derived from the silicone material described above does not arise. However, the upper temperature limit when using the resulting heat-conductive flexible sheet is at most 130° C., and thus, heat resistance as in using the silicone material cannot be obtained. Particularly, it is difficult to obtain a sheet having sufficiently satisfactory heat-aging resistance.

In addition, the curing reaction of the epoxy resin is easy to occur even at a low temperature because of high reactivity of the epoxy group thereof. Therefore, the epoxy resin also has the following problem in producing a heat-conductive sheet: it is difficult that the starting materials are heated to reduce their viscosity to thereby ensure a favorable viscosity in the kneading step in order that the heat-conductive filler as a main component is dispersed and filled into the epoxy resin at a high content.

Accordingly, as a binder for a heat-conductive sheet, there is a need for a material that is free from a silicone material and can provide a heat-conductive sheet excellent in flexibility as well as durability such as heat-aging resistance, hydrothermal resistance, and thermal shock resistance. For the material, excellent handleability in the kneading step in producing a heat-conductive sheet is also required.

The present invention has been made in order to solve the above problems, and the object thereof is to provide a heat-conductive flexible sheet that is formed of a non-silicone material and excellent in flexibility as well as durability such as heat-aging resistance, hydrothermal resistance, and thermal shock resistance, and also to provide a heat dissipation structure using the same.

Another object of the invention is to provide a resin composition that exhibits excellent handleability in the kneading step in producing a heat-conductive sheet, and thus can be suitably used as a binder material for a heat-conductive flexible sheet.

Solution to Problem

The present invention is based on the finding that a resin composition comprising a predetermined blocked urethane prepolymer, a predetermined epoxy compound, and a curing catalyst is suitable as a binder material for a heat-conductive flexible sheet in terms of handleability and properties of a cured product thereof.

Specifically, the present invention provides the following items [1] to [11].

[1] A resin composition comprising a blocked urethane prepolymer, an epoxy compound, and a curing catalyst,
the blocked urethane prepolymer being a reaction product of an aliphatic diisocyanate compound and a hydrogenated polybutadiene polyol having a hydroxy group at each of both ends, wherein the reaction product has at an end thereof an isocyanate group blocked with an aromatic hydroxy compound, and an amount of a structural unit derived from the aliphatic diisocyanate compound is 1.6 to 2.8 mole per mole of a structural unit derived from the hydrogenated polybutadiene polyol in the reaction product, and
the epoxy compound having 2 to 6 epoxy groups, wherein an amount of the epoxy group is 0.9 to 2.5 mole per mole of the hydroxy group of the aromatic hydroxy compound.

[2] The resin composition according to [1], wherein the epoxy compound has a molecular weight of less than 600 and an epoxy equivalent of less than 200 g/eq.

[3] The resin composition according to [1] or [2], wherein the hydrogenated polybutadiene polyol has a number average molecular weight of 800 to 5000.

[4] The resin composition according to any one of [1] to [3], wherein the aromatic hydroxy compound is resorcinol.

[5] The resin composition according to any one of [1] to [4], wherein the curing catalyst is a quaternary ammonium salt.
[6] A method for producing the resin composition according to any one of [1] to [5], comprising the steps of:

reacting the aliphatic diisocyanate compound and the hydrogenated polybutadiene polyol in the presence of a urethanation catalyst to thereby obtain a reaction product having an isocyanate group at an end thereof, adding the aromatic hydroxy compound to the reaction product and carrying out a blocking reaction of the isocyanate group to thereby obtain the blocked urethane prepolymer, and blending the blocked urethane prepolymer at least with the epoxy compound and the curing catalyst to thereby obtain the resin composition.

[7] The method according to [6], wherein when obtaining the blocked urethane prepolymer, the aromatic hydroxy compound is added in an amount such that the amount of the hydroxy group of the aromatic hydroxy compound is 0.9 to 1.1 mole per mole of the isocyanate group of the aliphatic diisocyanate compound.

[8] A heat-conductive flexible sheet being a resin sheet formed of a cured product of a mixed composition comprising the resin composition according to any one of [1] to [5] and a heat-conductive inorganic filler, the heat-conductive flexible sheet having a hardness of 95 or less as determined through the hardness test of type C according to JIS K 7312:1996.

[9] The heat-conductive flexible sheet according to [8], wherein the heat-conductive inorganic filler is surface-treated with an aluminum chelate compound.

[10] A method for producing the heat-conductive flexible sheet according to [8] or [9], comprising the steps of:

mixing the resin composition with at least the heat-conductive inorganic filler to thereby prepare the mixed composition, kneading and pressing the mixed composition to thereby obtain an uncured precursor, and curing the precursor at 120 to 250° C. under compression to thereby obtain the heat-conductive flexible sheet.

[11] A heat dissipation structure comprising a heating element, a radiator, and the heat-conductive flexible sheet according to [8] or [9] sandwiched therebetween.

Advantageous Effects of Invention

The resin composition of the present invention exhibits excellent handleability in the kneading step in producing a heat-conductive sheet, and thus can be suitably used as a binder material for a heat-conductive flexible sheet.

The heat-conductive flexible sheet of the present invention, in which the resin composition described above, a non-silicone material, is used as a binder, has excellent flexibility as well as excellent durability such as heat-aging resistance, hydrothermal resistance, and thermal shock resistance. Therefore, an excellent heat dissipation structure can be provided by using the heat-conductive flexible sheet without the occurrence of a contact fault or a conduction failure of an electronic/electric device.

DESCRIPTION OF EMBODIMENT

The resin composition and the method for producing the same, a heat-conductive flexible sheet using the resin composition and the method for producing the same, and the heat dissipation structure using the heat-conductive flexible sheet of the present invention will be described in detail below.

[Resin Composition]

The resin composition of the present invention comprises a blocked urethane prepolymer, an epoxy compound, and a curing catalyst. The blocked urethane prepolymer is a reaction product of an aliphatic diisocyanate compound and a hydrogenated polybutadiene polyol having a hydroxy group at each of both ends, and the reaction product has at an end thereof an isocyanate group blocked with an aromatic hydroxy compound. In the reaction product, the amount of a structural unit derived from the aliphatic diisocyanate compound is 1.6 to 2.8 mole per mole of a structural unit derived from the hydrogenated polybutadiene polyol. The epoxy compound is characterized by that it has 2 to 6 epoxy groups and that the amount of the epoxy group is 0.9 to 2.5 mole per mole of the hydroxy group of the aromatic hydroxy compound.

The resin composition can be mixed and kneaded with a heat-conductive filler in the production of the heat-conductive sheet at a temperature of 100° C. or less while exhibiting a moderate viscosity without curing, and also can maintain such a viscosity for at least 6 hours. Therefore, the resin composition can ensure sufficient kneading time and a moderate viscosity to uniformly fill and disperse a heat-conductive filler thereinto, and thus exhibits excellent handleability in the kneading step.

(Cured Product of Resin Composition)

A cured product of the resin composition of the present invention is produced by heating the resin composition at 120° C. or higher to allow the curing reaction to proceed, as described later.

The cured product has a gel network structure formed through mainly two kinds of crosslinking/polymerizing reactions.

The first crosslinking/polymerizing reaction is a multimerization reaction in which the isocyanate group blocked with the aromatic hydroxy compound at the end of the reaction product of the hydrogenated polybutadiene polyol and the aliphatic diisocyanate compound is deblocked to produce uretdione through dimerization or isocyanurate through trimerization. This provides properties such as flexibility, tackiness, and rubber elasticity of the cured product.

The second crosslinking/polymerizing reaction is a ring-opening reaction of the epoxy group of the epoxy compound by the hydroxy group of the aromatic hydroxy compound.

Furthermore, a curing reaction through a reaction between the deblocked isocyanate group and the epoxy group of the epoxy compound occurs.

It is seemed that the gel network in the cured product formed through these reactions is an interpenetrating polymer network (IPN) structure, and therefore, when a heat-conductive sheet including a large amount of a heat-conductive filler is produced using the resin composition, the resulting sheet has excellent flexibility as well as excellent durability such as heat-aging resistance.

(Blocked Urethane Prepolymer)

The blocked urethane prepolymer contained in the resin composition is a reaction product of an aliphatic diisocyanate compound and a hydrogenated polybutadiene polyol having a hydroxy group at each of both ends, and the reaction product has a structure in which an isocyanate group at the end thereof is blocked with an aromatic hydroxy compound. In the reaction product, the amount of a structural unit derived from the aliphatic diisocyanate compound is 1.6 to 2.8 mole per mole of a structural unit derived from the hydrogenated polybutadiene polyol.

For such a prepolymer as described above, it is difficult to specify the structure of the reaction product as a single compound. Then, the structure of the prepolymer is also difficult to specify as a single compound and is therefore represented by expression in a reaction product.

<Aliphatic Diisocyanate Compound>

An aliphatic diisocyanate compound is used as an isocyanate compound that is a structural material of the blocked urethane prepolymer and a reactant with the hydrogenated polybutadiene polyol. The term "aliphatic" used for the aliphatic diisocyanate compound means non-"aromatic" and the hydrocarbon group as the substitute group may be straight, branched, or cyclic.

Specific examples of the aliphatic diisocyanate compound include hexamethylene diisocyanate (HDI), dicyclohexylmethane diisocyanate (hydrogenated MDI), and isophorone diisocyanate (IPDI). These may be used singly or in combinations of two or more. Of these, hydrogenated MDI, IPDI, and the like exhibit large steric hindrance and it is therefore difficult for them to cause a multimerization reaction of the isocyanate. Thus, HDI, which has a relatively simple structure, is particularly preferable in view of ease to multimerize.

On the other hand, if an aromatic diisocyanate compound such as diphenylmethane diisocyanate (MDI) or toluene diisocyanate (TDI) is used to produce a blocked urethane prepolymer, the resulting prepolymer has urethane groups with large cohesive force and therefore a high melting point. Thus, the temperature range is narrow in which the resulting prepolymer can be mixed and kneaded with a heat-conductive filler while maintaining the state of the prepolymer without the occurrence of the curing reaction, and thus the resulting prepolymer exhibits poor handleability in the kneading step. Furthermore, there is a tendency that the urethane group derived from an aromatic diisocyanate compound has a lower decomposition temperature than that from an aliphatic diisocyanate compound, and the former cannot provide sufficient heat-aging resistance.

In the reaction product, the amount of a structural unit derived from the aliphatic diisocyanate compound is 1.6 to 2.8 mole, preferably 1.7 to 2.7 mole, more preferably 1.8 to 2.5 mole, per mole of a structural unit derived from the hydrogenated polybutadiene polyol.

If the amount of a structural unit derived from the aliphatic diisocyanate compound is less than 1.6 mole, the molecular weight of the blocked urethane prepolymer increases, and this leads to poor handleability of the resin composition as a binder when kneading in producing a heat-conductive sheet, resulting in difficulty in mixing the resin composition and the filler uniformly. On the other hand, if the amount of the structural unit derived from the aliphatic diisocyanate compound is more than 2.8 mole, the crosslinking density through the multimerization reaction of the isocyanate increases, and thus the cured product of the resin composition to be obtained cannot exhibit sufficient flexibility.

<Hydrogenated Polybutadiene Polyol>

The hydrogenated polybutadiene polyol, which is a structural material of the blocked urethane prepolymer and a reactant with the aliphatic diisocyanate compound, is a polyol prepared from butadiene as a starting material and having a hydroxy group at each of both ends in which polyol the residual double bonds have been hydrogenated. Inter alia, those having a high molecular weight tend to provide a cured product of the resin composition exhibiting flexibility. On the other hand, those having a low molecular weight can increase heat resistance.

The hydrogenated polybutadiene polyol preferably has a number average molecular weight of 800 to 5000 in view of viscosity, heat resistance, availability, and so on. The number average molecular weight in the present invention is a value calculated from the hydroxy value determined according to JIS K1557-1:2007.

As the hydrogenated polybutadiene polyol, a commercially available product can be suitably used, including GI-3000 (number average molecular weight: 3753 (nominal value in the catalog: 3000)), GI-2000 (nominal value of the number average molecular weight in the catalog: 2000), GI-1000 (nominal value of the number average molecular weight in the catalog: 1000) (all manufactured by NIPPON SODA CO., LTD.). These may be used singly or in combinations of two or more. Of these, GI-3000 is particularly preferable.

Polyester polyol, polyether polyol, polycarbonate diol, and the like, which are commonly used as a starting material for polyurethane, are not preferable because these provide poor heat-aging resistance, hydrothermal resistance, and thermal shock resistance compared to the hydrogenated polybutadiene polyol.

<Aromatic Hydroxy Compound>

The aromatic hydroxy compound is a compound used as a blocking agent for an isocyanate group at an end of the reaction product described above. The aromatic hydroxy compound is an aromatic compound having an aromatic ring one or more hydrogen atoms of which are replaced with a hydroxy group. The aromatic ring is preferably a benzene ring, and more preferably a benzenediol, which is formed by replacing two hydrogen atoms of a benzene ring each with a hydroxy group. The hydroxy group of the aromatic hydroxy compound reacts with the isocyanate group at an end of the reaction product described above to form a urethane bond to thereby block the end isocyanate group.

Amine compounds are also known as a blocking agent for isocyanate groups. However, amine compounds have high reactivity with epoxy compounds, which results in ease of the blocked urethane prepolymer to cure readily, and therefore, are not preferable.

Specific examples of the aromatic hydroxy compound include phenol, 1-cresol, 2-cresol, 3-cresol, 2,3-dimethylphenol, 2,4-dimethylphenol, 2,5-dimethylphenol, 2,6-dimethylphenol, 2,3,6-trimethylphenol, 2,4,6-trimethylphenol, 2,3,5-trimethylphenol, 3-isopropylphenol, 2-tert-butylphenol, 3-tert-butylphenol, 4-tert-butylphenol, 2,4-di-tert-butylphenol, 2,5-di-tert-butylphenol, 2,6-di-tert-butylphenol, 2,4,6-tri-tert-butylphenol, 2-isopropyl-5-methylphenol, 2,6-di-tert-butyl-4-methylphenol, 2-methoxyphenol, 3-methoxyphenol, 4-methoxyphenol, 2-ethoxyphenol, 3-ethoxyphenol, 4-ethoxyphenol, 2-propoxyphenol, 3-propoxyphenol, 4-propoxyphenol, 1,2-benzenediol, 1,3-benzenediol (resorcinol), 1,4-benzenediol, 1,3,5-benzenetriol, and 4-tert-butylcatechol. These may be used singly or in combinations of two or more.

Of these, resorcinol is particularly preferable. The deblocking temperature of resorcinol after blocking isocyanate groups is as relatively low as around 120° C., and therefore, resorcinol can be easily deblocked when curing the resin composition through the reaction between the isocyanate group and the epoxy group of the epoxy compound.

(Epoxy Compound)

The epoxy compound used in the present invention has two to six epoxy groups, and preferably has two to five epoxy groups with an average number thereof of 2.5 or more. If the epoxy compound has a single epoxy group, it is difficult to form a gel network through curing of the resin composition. On the other hand, if the epoxy compound has seven or more epoxy groups, it is difficult to form a favorable gel network with flexibility.

The amount of the epoxy groups of the epoxy compound is 0.9 to 2.5 mole, preferably 0.9 to 2.2 mole, more preferably 1.0 to 2.0 mole, even more preferably 1.0 to 1.2 mole, per mole of the hydroxy group of the aromatic hydroxy compound. If the amount of the epoxy groups is less than 0.9 mole, there is a tendency that heat-aging resistance is poor. On the other hand, if the amount of the epoxy groups is more than 2.5 mole, the resulting cured product of the resin composition has poor flexibility.

It is preferable that the epoxy compound be multifunctional and have a compact structure, in view of forming a favorable gel network through curing of the resin composition. In view of these, the epoxy compound preferably has a molecular weight of less than 600 and an epoxy equivalent of less than 200 g/eq. The molecular weight is more preferably 200 to 500, even more preferably 300 to 450.

A compound having a glycidylamine group as the epoxy group is suitably used in view of compatibility with other reactants in the resin composition and heat-aging resistance, hydrothermal resistance, and thermal shock resistance. Specific examples thereof include tetraglycidyl diaminodiphenyl methane and triglycidyl isocyanurate. These may be used singly or in combinations of two or more. Of these, tetraglycidyl diaminodiphenyl methane is particularly preferable.

(Curing Catalyst)

The curing catalyst in the resin composition deblocks the blocked isocyanate group of the reaction product to thereby promote the multimerization reaction of the isocyanate and also promote the reaction between the epoxy group of the epoxy compound and the phenolic hydroxy group of the aromatic hydroxy compound.

A quaternary ammonium salt is suitably used as the curing catalyst, and a tetraalkylammonium salt is more preferably used.

Specific examples thereof include tetramethylammonium 2-ethylhexanoate, tetraethylammonium 2-ethylhexanoate, ethyltrimethylammonium 2-ethylhexanoate, triethylmethylammonium 2-ethylhexanoate, tetramethylammonium formate, tetraethylammonium formate, ethyltrimethylammonium formate, triethylmethylammonium formate, tetramethylammonium phenolate, tetraethylammonium phenolate, ethyltrimethylammonium phenolate, and triethylmethylammonium phenolate. These may be used singly or in combinations of two or more. Of these, triethylmethylammonium 2-ethylhexanoate is particularly preferable.

The amount of the curing catalyst added is preferably 0.1 to 1 mass %, more preferably 0.2 to 0.9 mass %, even more preferably 0.3 to 0.6 mass %, based on the total amount of the blocked urethane prepolymer and the epoxy compound.

(Additives)

To the resin composition, additives such as a flame retardant, a plasticizer, and an antioxidant may be added in addition to the blocked urethane prepolymer, the epoxy compound, and the curing catalyst according to the intended use and the desired properties of the cured product of the resin composition. These additives preferably have compatibility with other components in the resin composition. The additives are each optionally added as needed, and may be used singly or in combinations of two or more.

Examples of the flame retardant include a phosphazene compound and a condensed phosphate ester. The amount of the flame retardant added is preferably 1 to 20 mass %, more preferably 1 to 15 mass %, even more preferably 3 to 12 mass % based on the total amount of the blocked urethane prepolymer and the epoxy compound.

Examples of the plasticizer include a xylene resin, liquid paraffin, and an ester-based plasticizer.

Examples of the antioxidant include a hindered phenol antioxidant.

The amount of each additives such as the plasticizer or the antioxidant is preferably 0.5 to 10 mass %, more preferably 0.7 to 8 mass %, even more preferably 0.8 to 5 mass % based on the total amount of the blocked urethane prepolymer and the epoxy compound.

The total amount of the blocked urethane prepolymer and the epoxy compound is preferably 75 to 100 mass %, more preferably 80 to 100 mass %, even more preferably 85 to 100 mass % based on the components contained in the resin composition, excluding a solvent, in view of allowing to the cured product of the resin composition to exhibit excellent properties.

[Method for Producing Resin Composition]

The resin composition of the present invention is not particularly limited by the production method thereof, and can be suitably produced according to the method of the present invention.

The method for producing the resin composition of the present invention comprises: (1) the step of reacting the aliphatic diisocyanate compound and the hydrogenated polybutadiene polyol in the presence of a urethanation catalyst to thereby obtain the reaction product having an isocyanate group at an end thereof (2) the step of adding the aromatic hydroxy compound to the reaction product and carrying out a blocking reaction of the isocyanate group to thereby obtain the blocked urethane prepolymer; and (3) the step of blending the blocked urethane prepolymer at least with the epoxy compound and the curing catalyst to thereby obtain the resin composition.

(Step (1))

In step (1), the aliphatic diisocyanate compound and the hydrogenated polybutadiene polyol are allowed to react with each other in the presence of a urethanation catalyst to thereby obtain a reaction product having an isocyanate group at an end thereof.

<Urethanation Catalyst>

The reaction product to be obtained in step (1) is produced through urethanation reaction in which the isocyanate group of the aliphatic diisocyanate compound and the hydroxy group of the hydrogenated polybutadiene polyol at each of both ends thereof form a urethane bond. Such a urethanation reaction is preferably carried out using a urethanation catalyst in order to promote the reaction.

Heating at 100° C. or more is needed in order to allow the urethanation reaction to proceed without any urethanation catalyst. Such a high temperature is not preferable because the aliphatic diisocyanate compound readily volatilizes to result in an ununiform reaction system.

Examples of the urethanation catalyst include, but not particularly limited to, 1,8-diazabicyclo(5.4.0)undecene-7 (DBU), and 1,5-diazabicyclo[4.3.0]nonene-5 (DBN). These may be used singly or in combinations of two or more. Of these, DBU is preferably used.

The amount of the urethanation catalyst added may be arbitrary as long as the urethanation reaction is sufficiently promoted. The amount is preferably 0.01 to 0.5 mass %, more preferably 0.01 to 0.2 mass %, even more preferably 0.02 to 0.1 mass %, based on the total mass of the aliphatic diisocyanate compound, the hydrogenated polybutadiene polyol, and the urethanation catalyst.

(Step (2))

In step (2), the aromatic hydroxy compound is added to the reaction product obtained in step (1), and a blocking reaction of the isocyanate group is carried out to thereby obtain the blocked urethane prepolymer.

The amount of the aromatic hydroxy compound added is preferably such that the amount of the hydroxy group of the aromatic hydroxy compound is 0.9 to 1.1 mole per mole of the isocyanate group of the aliphatic diisocyanate compound, more preferably 1.0 mole, i.e., the equivalent amount in view of prevention of increase in viscosity of the resin composition and flexibility of a cured product of the resin composition.

<Solvent>

The blocking reaction with the aromatic hydroxy compound involves viscosity increase. In addition, the aromatic hydroxy compound starts the blocking reaction after it melts at a temperature equal to or higher than the melting point thereof. The deblocking reaction, which is a reversible reaction, also occurs at such a high temperature, and thus, the blocking reaction is difficult to complete.

Therefore, in order to efficiently complete the blocking reaction, it is preferable that the reaction temperature be decreased to 80 to 60° C., preferably around 70° C. while the reactants are appropriately diluted with a solvent to decrease the viscosity of the reaction system.

Examples of the solvent include toluene and tetrahydrofuran (THF) in view of the solubility of the reactants. These may be used singly or in combinations of two or more. Of these, toluene is suitably used in view of volatility and low hygroscopicity.

The blocked urethane prepolymer is preferably prepared in the form of a solution diluted with a solvent such as THF in order to ensure the filling capability and dispersibility of the heat-conductive filler to be mixed when producing a heat-conductive sheet using the resin composition obtained.

The strength of the blocked urethane prepolymer solution at this time is preferably 20 to 60 mass %, more preferably 30 to 50 mass %, even more preferably 35 to 45 mass % in view of ensuring the filling capability and dispersibility of the heat-conductive filler and the production efficiency when producing a heat-conductive sheet using the resin composition obtained.

(Step (3))

In step (3), the blocked urethane prepolymer obtained in step (2) is blended at least with the epoxy compound and the curing catalyst to thereby obtain the resin composition.

The resin composition is preferably obtained by blending the blocked urethane prepolymer with the epoxy compound and the curing catalyst and then mixing them uniformly. The mixing method is not particularly limited as long as the blended materials can be uniformly dissolved/dispersed in the resin composition. For example, the blended materials may be put in a container, followed by sealing and shaking the container to mix or by stirring the blended materials in the container using a stirring blade.

The additives described above, such as a flame retardant, a plasticizer, and an antioxidant, may be added to the resin composition in addition to the blocked urethane prepolymer, the epoxy compound, and the curing catalyst according to the intended use and the desired properties of the cured product of the resin composition.

[Heat-Conductive Flexible Sheet]

The heat-conductive flexible sheet of the present invention is a resin sheet formed of a cured product of a mixed composition comprising the resin composition of the present invention as described above and a heat-conductive inorganic filler. The heat-conductive flexible sheet of the present invention is characterized by having hardness of 95 or less as determined through the hardness test of type C according to JIS K 7312:1996.

The heat-conductive sheet using the resin composition of the present invention as a binder is a heat-conductive flexible sheet having excellent flexibility. It can be said that a resin sheet having a hardness of 95 or less has flexibility suitable for using as a heat-conductive sheet.

Specifically, the hardness is determined according to the method described in Examples later using ASKER Durometer Type C.

The heat-conductive flexible sheet of the present invention is not particularly limited by its way to use, and may be applied in the same way to use as for conventional heat-conductive sheets.

(Heat-Conductive Inorganic Filler)

In the heat-conductive flexible sheet of the present invention, an inorganic filler is used as a heat-conductive filler. In view of insulation, examples of the heat-conductive inorganic filler include magnesia, alumina, boron nitride, aluminum nitride, magnesium hydroxide, aluminum hydroxide, and silica. These may be used singly or in combinations of two or more. An aluminum powder, carbon black, a graphite powder, or the like may also be blended as long as the insulation is not impaired. The shape of the heat-conductive inorganic filler is not particularly limited, and examples thereof include a crushed shape, a spherical shape, and a plate shape.

Taking a balance between the performance and the cost into consideration, preferred are a mixture of crushed magnesia, spherical magnesia, and spherical alumina, a mixture of spherical magnesia and two types of spherical alumina different in the particle size, and a mixture of crushed magnesia and crushed aluminum nitride, for example. The mixing ratio of the mixture in these cases can be appropriately decided taking into consideration the compatibility with the resin composition as a binder, the dispersibility/fluidity and the viscosity upon mixing with the resin composition, and also flammability of the heat-conductive flexible sheet.

The particle size of the heat-conductive inorganic filler is preferably a level such that it does not impair the filling capability/dispersibility into the resin composition as a binder as well as the flexibility of the heat-conductive flexible sheet, and specifically the average particle size is preferably 0.1 to 150 µm, more preferably 0.5 to 100 µm, even more preferably 1 to 80 µm. The average particle size of the heat-conductive inorganic filler in the present invention is a particle size at the 50% cumulative volume in a particle size distribution determined using a laser diffraction particle size distribution analyzer.

The heat-conductive inorganic filler is preferably surface-treated with a coupling agent in view of increasing the compatibility with the resin composition as a binder. Specifically, an aluminum chelate compound is suitably used as the coupling agent. Inter alia, aluminum alkylacetoacetate diisopropylate is particularly preferable.

The aluminum chelate compound is preferably added in an amount of 0.1 to 5 mass %, more preferably 0.3 to 2 mass %, even more preferably 0.5 to 1.5 mass %, based on the total mass of the heat-conductive inorganic filler.

In view of efficiently increasing the compatibility with the resin composition, the surface treatment is preferably carried out in the following manner: the heat-conductive inorganic filler and the aluminum chelate compound are dispersed in THF, and THF is removed therefrom, followed by drying the residue.

[Method for Producing Heat-Conductive Flexible Sheet]

The heat-conductive flexible sheet of the present invention is not particularly limited by the production method thereof, and can be suitably produced according to the production method of the present invention.

The method for producing the heat-conductive flexible sheet of the present invention comprises: (4) the step of mixing the resin composition with at least the heat-conductive inorganic filler to thereby prepare the mixed composition; (5) the step of kneading and pressing the mixed composition to thereby obtain an uncured precursor; and (6) the step of curing the precursor at 120 to 250° C. under compression to thereby obtain the heat-conductive flexible sheet.

According to the method of the present invention, the curing reaction of the resin composition in the mixed composition in a uniform state is allowed to start and proceed when heating under compression in step (6). Thus, the handleability in production is excellent, and a uniform heat-conductive flexible sheet can be readily obtained.

(Step (4))

In step (4), the resin composition is mixed with at least the heat-conductive inorganic filler to thereby prepare the mixed composition.

The resin composition is mixed as a binder for the heat-conductive inorganic filler. As described above, additives such as a flame retardant, a plasticizer, and an antioxidant may also be added appropriately, and the resin composition may be diluted with a solvent for ease to mix and then used.

<Amount Blended>

The blending ratio between the resin composition and the heat-conductive inorganic filler is not particularly limited, and can be appropriately adjusted according to the heat conductivity, flexibility, and the like desired. The amount of the resin composition blended is preferably 5 to 25 parts by mass, more preferably 7 to 20 parts by mass, even more preferably 10 to 15 parts by mass, per 100 parts by mass of the total mass of the heat-conductive inorganic filler.

<Mixing Method>

The method for mixing the resin composition and the heat-conductive inorganic filler is not particularly limited. In the case where the resin composition is diluted with a solvent and then used, the mixed composition can be obtained by, for example, mixing the diluted resin composition with the heat-conductive inorganic filler using a stirrer or disperser such as a planetary centrifugal mixer, and then removing the solvent therefrom by volatilization or drying. In the case where no solvent is used, the resin composition and the heat-conductive inorganic filler can be blended in a bulk state using a kneader such as a three roll mill to thereby obtain the mixed composition.

(Step (5))

In step (5), the mixed composition obtained in step (4) is kneaded and pressed to thereby obtain an uncured precursor. Kneading and pressing can be carried out using, for example, a press machine such as a heat flat press machine. Kneading and pressing is carried out at a temperature of 90° C. or less so that the mixed composition can maintain the uncured state thereof. It is preferable to carry out kneading and pressing repeatedly while changing the pressure for pressing, so that the mixed composition becomes a uniform state.

Pressing may be carried out, for example, with a sheet made of a fluororesin such as polytetrafluoroethylene (PTFE) interposed, in view of preventing adhesion of the precursor to the press machine for pressing.

In order to obtain a uniform heat-conductive flexible sheet, the precursor is preferably subjected to a degassing treatment before step (6). As the degassing treatment, preferred is vacuum degassing at a heating temperature of 150° C. or less for a short time, for example, about 2 to 10 minutes.

The shape of the precursor is preferably, but not particularly limited to, a plate in view of forming into a sheet in step (6) and ease to carry out degassing.

(Step (6))

In step (6), the uncured precursor obtained in step (5) is cured at 120 to 250° C. under compression to thereby obtain the heat-conductive flexible sheet. Heating at 120 to 250° C. in this step allows the curing reaction of the resin composition to start and proceed to obtain a uniform sheet-shaped article formed of the cured product of the mixed composition.

Heating under compression can be carried out using a heat press machine commonly used, and thus a sheet can be formed. At this time, heating under compression may be carried out, for example, with a sheet made of a fluororesin such as PTFE interposed, as in pressing described above, in view of preventing adhesion of the precursor to the heat press machine.

The heating temperature is preferably 120 to 250° C., more preferably 170 to 230° C., even more preferably 185 to 200° C. in view of allowing the curing reaction of the resin composition to start and moderately proceed.

The compression pressure and compression time is appropriately set according to, for example, the desired thickness of the sheet-shaped article and the amount of the precursor. Usually the pressure is about 0.1 to 5 MPa and the time is about 5 to 60 minutes.

[Heat Dissipation Structure]

The heat dissipation structure of the present invention comprises a heating element, a radiator, and the heat-conductive flexible sheet of the present invention as described above sandwiched therebetween. Heat can be efficiently dissipated from the heating element by sandwiching the heat-conductive flexible sheet of the present invention between the heating element and the radiator. According to the heat dissipation structure of the present invention, problems such as a contact fault or a conduction failure of an electronic/electric device due to volatilization of siloxanes having a low molecular weight do not arise, since the heat-conductive flexible sheet of the present invention is free from a silicone material.

(Heating Element/Radiator)

The heating element is not particularly limited, and applicable examples thereof include an electronic member involving heat generation up to 150° C. when used in an electronic/electric device, such as a LED, a CPU, and a power IC.

The radiator is also not particularly limited, and may be a radiator for the heating element conventionally used in an electronic/electric device, and applicable examples thereof include a heat sink, a metal frame, and a heat slinger.

The method and mode of sandwiching the heat-conductive flexible sheet is not particularly limited, and the sheet can be used in the same manner as for a conventional heat-conductive sheet.

EXAMPLES

The present invention will be described below in more detail by way of examples, but the present invention is not limited thereby.

[Production of Blocked Urethane Prepolymer (A)]

Blocked urethane prepolymers (A1) to (A5) were produced according to the method described in Production Examples below. The starting materials used for producing each blocked urethane prepolymer are shown below.

Aliphatic Diisocyanate Compound (a1)

Hexamethylene diisocyanate; "Desmodur H", manufactured by Sumika Covestro Urethane Co., Ltd.

Polyol (a2)

(a2-1) Hydrogenated polybutadiene polyol; "GI-3000", manufactured by NIPPON SODA CO., LTD., molecular weight 3753, hydroxy value 29.9 KOHmg/g (a2-2) Polyester polyol: polyester of 3-methyl-1,5-pentanediol and adipic acid; "P3010", manufactured by KURARAY CO., LTD., molecular weight 3082, hydroxy value 36.4 KOHmg/g (a2-3) Polyether polyol: ring-opened polymer of 3-methyltetrahydrofuran and THF (estimated); "PTG-L3000", manufactured by Hodogaya Chemical Co., Ltd., molecular weight 2992, hydroxy value 37.2 KOHmg/g Blocking Agent for Isocyanate Groups (a3)

(a3-1) Resorcinol; special grade reagent; manufactured by Wako Pure Chemical Corporation (a3-2) Ethylenediamine; special grade reagent; manufactured by Wako Pure Chemical Corporation Urethanation Catalyst 1,8-diazabicyclo[5.4.0]undecene-7 (DBU), manufactured by San-Apro Ltd.

Solvent

Toluene; special grade reagent; manufactured by Wako Pure Chemical Corporation, dehydrated by molecular sieve 4 A THF; special grade reagent; manufactured by Wako Pure Chemical Corporation (Production Example 1) Production of Blocked Urethane Prepolymer (A1)

3.26 g of aliphatic diisocyanate compound (a1) and 34.59 g of polyol (a2-1) were put in a 300-ml separable flask, and a stirring blade, a stirring motor, a Dimroth condenser, and a nitrogen inlet tube were equipped to the flask. The flask was purged with nitrogen at a flow rate of 200 ml per minute, and put in an oil bath at 75° C. The content was stirred at 30 rpm for 5 minutes for premixing, and the number of revolutions was then increased to 150 rpm to carry out the reaction.

After 5 minutes, it was confirmed that the content in the flask was sufficiently uniform, and then 0.02 g of DBU as a urethanation catalyst was added thereto. After 3 hours, an infrared absorption spectrum (IR spectrum) of the content was measured, and as a result, it was confirmed that a signal at 3300 $cm^{-1}$ assigned to hydroxy groups was disappeared.

The temperature of the oil bath was increased to 125° C., and after the flask was sufficiently heated, 2.13 g of blocking agent for isocyanate groups (a3-1) was added thereto. The content was stirred at 400 rpm for 3 minutes, and then the temperature of the oil bath was lowered to 110° C., followed by continuing stirring at 50 rpm. It was confirmed that the temperature in the flask reached 110° C., and then 22.16 g of toluene was added thereto. The stirring speed was gradually increased to 150 rpm and then kept, and the temperature of the oil bath was lowered to 70° C. The reaction was carried out for 3 hours. An IR spectrum of the content was measured, and it was thus confirmed that a signal at 2270 $cm^{-1}$ assigned to isocyanate groups was disappeared therein.

After cooling to room temperature, 37.84 g of THF was added thereto, and the content was stirred until it became uniform to thereby obtain 100.00 g of the blocked urethane prepolymer (A1) solution (strength 40.0 mass % (calculated value)).

(Production Examples 2 to 7) Production of Blocked Urethane Prepolymers (A2) to (A7)

Blocked urethane prepolymer (A2) to (A7) solutions were obtained in the same manner as in Production Example 1, except that the formulation of the starting materials were changed as shown in Production Examples 2 to 7 in Table 1 below, respectively.

(Production Example 8) Production of Blocked Urethane Prepolymer (A8)

3.10 g of aliphatic diisocyanate compound (a1) and 34.59 g of polyol (a2-1) were put in a 500-ml separable flask, and a stirring blade, a stirring motor, a Dimroth condenser, and a nitrogen inlet tube were equipped to the flask. The flask was purged with nitrogen at a flow rate of 200 ml per minute, and put in an oil bath at 75° C. The content was stirred at 30 rpm for 5 minutes for premixing, and the number of revolutions was then increased to 150 rpm to carry out the reaction.

After 5 minutes, it was confirmed that the content in the flask was sufficiently uniform, and then 0.02 g of DBU as a urethanation catalyst was added thereto. After 3 hours, an infrared absorption spectrum (IR spectrum) of the content was measured, and as a result, it was confirmed that a signal at 3300 $cm^{-1}$ assigned to hydroxy groups was disappeared. 339.39 g of toluene was added thereto to thereby obtain a 10.0 mass % solution in toluene.

553 g of a 5 mass % solution of blocking agent for isocyanate groups (a3-2) in THF was put in a 2000-ml separable flask. The flask was purged with nitrogen and cooled to 5° C. in a water bath, and then the content was stirred at 300 rpm. The solution of the reaction product of aliphatic diisocyanate compound (a1) and polyol (a2-1) obtained above in toluene was dropped thereto over 3 hours through a drop funnel. After completion of dropping, the temperature of the water bath was increased to 40° C., and the reaction was carried out for 1 hour while stirring at 150 rpm. An IR spectrum of the content was measured, and it was thus confirmed that a signal at 2270 $cm^{-1}$ assigned to isocyanate groups was disappeared therein.

The solvent and the excess blocking agent for isocyanate groups (a3-2: ethylenediamine) in the content were distilled off by a rotatory evaporator, and the residue was further subjected to vacuum drying treatment at 160° C. for 3 days to thereby obtain a purified product of the blocked urethane prepolymer.

40 g of the blocked urethane prepolymer obtained was put in a 300-ml separable flask. A mixed solvent of 22.22 g of toluene and 37.78 g of THF (total 60.00 g) was poured into the flask, and the resultant was stirred at 150 rpm under nitrogen atmosphere under reflux in an oil bath at 90° C. for 5 hours, to thereby obtain the blocked urethane prepolymer (A8) solution (strength 40.0 mass %).

TABLE 1

| Production Example | 1 | 2 | 3 | 4 | 5 | 6 | 7 | 8 |
|---|---|---|---|---|---|---|---|---|
| Blocked urethane prepolymer (A) solution | A1 | A2 | A3 | A4 | A5 | A6 | A7 | A8 |
| Aliphatic diisocyanate compound (a1) [g] | 3.26 | 2.86 | 3.77 | 2.42 | 4.40 | 3.85 | 3.95 | 3.10 |
| vs. Polyol (a2) (molar ratio) | 2.1 | 1.8 | 2.5 | 1.5 | 3.0 | 2.1 | 2.1 | 2.0 |
| Polyol (a2) [g] | a2-1 | a2-1 | a2-1 | a2-1 | a2-1 | a2-2 | a2-3 | a2-1 |
|  | 34.59 | 35.25 | 33.73 | 35.98 | 32.70 | 33.61 | 33.45 | 34.59 |
| Blocking agent for isocyanate groups (a3) [g] | a3-1 | a3-1 | a3-1 | a3-1 | a3-1 | a3-1 | a3-1 | a3-2 |
|  | 2.13 | 1.87 | 2.47 | 1.58 | 2.87 | 2.52 | 2.59 | 27.65 |
| vs. Polyol (a2) (molar ratio) | 2.1 | 1.8 | 2.5 | 1.5 | 3.0 | 2.1 | 2.1 | 50 |
| Urethanation catalyst [g] | 0.02 | 0.02 | 0.02 | 0.02 | 0.02 | 0.02 | 0.02 | 0.02 |
| vs. Total of (a1) + (a2) + (a3) [mass %] | 0.05 | 0.05 | 0.05 | 0.05 | 0.05 | 0.05 | 0.05 | 0.05 |
| Solvent Toluene [g] | 22.16 | 22.56 | 21.62 | 23.06 | 20.96 | 23.53 | 23.42 | 22.22 |
| THF [g] | 37.84 | 37.44 | 38.39 | 36.95 | 39.04 | 36.47 | 36.58 | 37.78 |

[Production of Resin Composition]

Resin compositions were each produced according to the method described in Examples or Comparative Examples below. The starting materials used for producing each resin composition are shown below.

Blocked Urethane Prepolymer (A)

Blocked urethane prepolymer (A1) to (A8) produced in Production Examples 1 to 8 described above Epoxy Compound (B)

Tetraglycidyl diaminodiphenyl methane; "EPOTOTO YH-434L", manufactured by NIPPON STEEL Chemical & Material Co., Ltd., epoxy equivalent 118.1 g/eq Curing Catalyst (C)

Triethylmethylammonium 2-ethylhexanoate; "U-CAT 18X", manufactured by San-Apro Ltd.

Additives

Antioxidant: 3,9-bis[2-[3-(3-tert-butyl-4-hydroxy-5-methylphenyl)pyropionyloxy]-1,1-dimethylethyl]-2,4,8,10-tetraoxaspiro[5.5]undecane; "SUMILIZER® GA-80", manufactured by Sumitomo Chemical Co., Ltd.

Flame retardant: phosphazene flame retardant; "SPB-100", manufactured by Otsuka Chemical Co., Ltd.

Plasticizer: xylene-based resin, "NIKANOL® LR", manufactured by Fudow Co., Ltd.

THF

Special grade reagent; manufactured by Wako Pure Chemical Corporation

Example 1

100.00 g of the blocked urethane prepolymer (A1) solution, 9.53 g of a 50.5 mass % solution of epoxy compound (B) in THF, 2.24 g of a 10 mass % solution of curing catalyst (C) in THF, and 0.45 g of the antioxidant, 4.48 g of the flame retardant, and 1.34 g of the plasticizer as additives were put in a 250-ml polyethylene jar, followed by shaking for mixing to thereby obtain a resin composition in the form of a solution (strength 43.46 mass %).

Examples 2 to 7 and Comparative Examples 1 to 7

Resin compositions in the form of a solution were each obtained in the same manner as in Example 1, except that the formulation of the starting materials were changed as shown in Examples 2 to 7 and Comparative Examples 1 to 7 in Table 2 below.

When preparing the resin composition in the form of a solution in Comparative Example 7, the viscosity of the solution increased, and it was difficult to use it for producing a sheet-shaped article. It is probably because polymerization through the reaction between the terminal amino groups of blocking agent for isocyanate groups (a3-2) and epoxy compound (B) was extremely rapid.

TABLE 2

|  | Example | | | | | | | Comparative Example | | | | | | |
|---|---|---|---|---|---|---|---|---|---|---|---|---|---|---|
| Resin composition in form of solution | 1 | 2 | 3 | 4 | 5 | 6 | 7 | 1 | 2 | 3 | 4 | 5 | 6 | 7 |
| Blocked urethane prepolymer (A) solution (strength of solution 40.0 mass %) 100.00 g | A1 | A1 | A1 | A2 | A3 | A1 | A1 | A4 | A5 | A1 | A1 | A6 | A7 | A8 |
| Epoxy compound (B) solution (strength of solution 50.5 mass %) [g] | 9.53 | 9.08 | 18.10 | 7.91 | 10.50 | 9.08 | 9.08 | 6.70 | 12.20 | 7.25 | 27.20 | 10.70 | 11.00 | 4.44 |
| Curing catalyst (C) solution (strength of solution 10.0 mass %) [g] | 2.24 | 2.24 | 2.46 | 2.20 | 2.26 | 2.24 | 2.24 | 2.17 | 2.31 | 2.18 | 2.69 | 2.27 | 2.28 | 2.10 |
| (C)/[(A) + (B)] (in terms of solid content) [mass %] | 0.50 | 0.50 | 0.50 | 0.50 | 0.50 | 0.50 | 0.50 | 0.50 | 0.50 | 0.50 | 0.50 | 0.50 | 0.50 | 0.50 |
| Additives [g] | | | | | | | | | | | | | | |
| Flame retardant | 4.48 | 4.46 | 4.91 | 4.40 | 4.53 | 4.46 | 4.46 | 4.34 | 4.62 | 4.37 | 5.37 | 4.54 | 4.56 | 4.22 |
| Plasticizer | 1.34 | 1.34 | 1.47 | 1.32 | 1.36 | 1.34 | 1.34 | 1.30 | 1.38 | 1.31 | 1.61 | 1.36 | 1.37 | 1.27 |
| Antioxidant | 0.45 | 0.45 | 0.49 | 0.44 | 0.45 | 0.45 | 0.45 | 0.43 | 0.46 | 0.44 | 0.54 | 0.45 | 0.46 | 0.42 |
| [Epoxy group of (B)]/[Hydroxy group of (a3-1) or Amino group of (a3-2)] (molar ratio) | a3-1 | a3-1 | a3-1 | a3-1 | a3-1 | a3-1 | a3-1 | a3-1 | a3-1 | a3-1 | a3-1 | a3-1 | a3-1 | a3-2 |
|  | 1.05 | 1.00 | 2.00 | 1.00 | 1.00 | 1.00 | 1.00 | 1.00 | 1.00 | 0.80 | 3.00 | 1.00 | 1.00 | 1.00 |
| Solid content [mass %] | 43.5 | 43.4 | 44.2 | 43.3 | 43.5 | 43.4 | 43.4 | 43.2 | 43.7 | 43.3 | 44.8 | 43.6 | 43.6 | 43.0 |

Preparation of Heat-Conductive Inorganic Filler (Preparation Example 1) Heat-Conductive Inorganic Filler (F1)

44.75 g of crushed magnesia (average particle size 60 µm), 21.05 g of spherical magnesia (average particle size 20 µm), and 10.40 g of spherical alumina (average particle size 7 µm) were put in a 100-ml polyethylene jar, followed by shaking for mixing.

0.87 g of aluminum alkylacetoacetate diisopropylate and 22.86 g of THF were added thereto, followed by shaking for mixing.

Then, the resultant content was stirred using a planetary centrifugal mixer at 2000 rpm for 2 minutes. Then, the content were subjected to dispersing treatment for 30 minutes using an ultrasonic cleaning machine, and stirred again using a planetary centrifugal mixer at 2000 rpm for 2 minutes. The content was dried by hot air at 60° C., and further vacuum dried at 70° C. for 5 hours to remove THF therefrom to thereby obtain heat-conductive inorganic filler (F1).

(Preparation Example 2) Heat-Conductive Inorganic Filler (F2)

43.47 g of spherical magnesia (average particle size 20 µm), 22.60 g of spherical alumina (average particle size 5 µm), and 10.13 g of spherical alumina (average particle size 3 µm) were put in a 100-ml polyethylene jar, followed by shaking for mixing.

0.86 g of aluminum alkylacetoacetate diisopropylate and 22.86 g of THF were added thereto, followed by shaking for mixing.

The subsequent treatment was conducted in the same manner as in Preparation Example 1 to thereby obtain heat-conductive inorganic filler (F2).

(Preparation Example 3) Heat-Conductive Inorganic Filler (F3)

54.94 g of crushed magnesia (average particle size 60 µm) and 21.26 g of crushed aluminum nitride (average particle size 13 µm) were put in a 100-ml polyethylene jar, followed by shaking for mixing.

0.87 g of aluminum alkylacetoacetate diisopropylate and 22.86 g of THF were added thereto, followed by shaking for mixing.

The subsequent treatment was conducted in the same manner as in Preparation Example 1 to thereby obtain heat-conductive inorganic filler (F3).

Production of Sheet-Shaped Article
(Heat-Conductive Flexible Sheet)

Example 8

In a 50-ml tubular bottle with a screw cap, 10.00 g of heat-conductive inorganic filler (F1) and 2.84 g of the resin composition in the form of solution in Example 1 were put, and the content was stirred using a planetary centrifugal mixer at 2000 rpm for 2 minutes. Then, the resultant was subjected to dispersing treatment for 30 minutes using an ultrasonic cleaning machine and stirred again using a planetary centrifugal mixer at 2000 rpm for 2 minutes to prepare a mixed composition. The mixed composition was taken out to a stainless tray, and the tray with the mixed composition was put on a hot plate at 80° C. and heated for 1 hour. Then the mixed composition was vacuum dried at 90° C. for 30 minutes to allow the solvent to volatilize to remove.

About 11 g of the mixed composition after removing the solvent, which was a lump having a size of about 30 mm, was sandwiched between PTFE sheets having a thickness of 200 µm, and kneaded and pressed by repeatedly applying pressure thereto from the outer surfaces of the upper and lower PTFE sheets using a heat flat press machine at 90° C. Kneading and pressing operation were carried out repeatedly, specifically twenty times total with folding every time, at a pressure of 1.0 kN for first ten times and then at a gradually increasing pressure from 1.1 kN in 0.1 kN increments for additional ten times, to thereby obtain an uncured precursor in a plate shape having a final thickness of about 700 µm and a diameter of about 80 mm. Then, the PTFE sheet on the upper surface of the precursor was removed, and this precursor was subjected to vacuum degassing at 140° C. for 3 minutes.

The degassed precursor with two shims each having a thickness of 500 µm was sandwiched between PTPE sheets having a thickness of 200 µm, and heated at 185° C. under compression at 1.2 kN for 30 seconds, 5 kN for 2 minutes, and 10 kN for 12 minutes and 30 seconds, using a small compression molding machine. The resultant was further heated under compression at 1.2 kN for 15 minutes to thereby obtain a heat-conductive flexible sheet, which was a sheet-shaped article having a final thickness of about 500 to 650 µm and a diameter of about 100 mm.

Examples 9 to 14 and Comparative Examples 8 to 13

Sheet-shaped articles were obtained in the same manner as in Example 8, except that the resin composition and the heat-conductive inorganic filler were changed as shown in Examples 9 to 14 and Comparative Examples 8 to 13 in Table 3 below.

[Measurements and Evaluations]

Sheet-shaped articles obtained in Examples and Comparative Examples were subjected to various measurements and evaluations below. The results of the measurements and evaluations are shown in Table 3.

(Ductility)

The ductility in kneading is a measure for determining whether the curing reaction proceeds when obtaining a precursor.

A resin composition a curing reaction of which proceeds when obtaining a precursor has poor ductility and poor fabricability into a heat-conductive sheet.

The evaluation was made through visual observation when obtain a precursor. The evaluation criteria are as follows.

Excellent: ductile to about 700 µm in thickness and capable of providing a precursor having uniform surface without cracking.

Good: ductile to about 800 µm in thickness and capable of providing a precursor having uniform surface without cracking.

Fair: ductile to merely 900 µm or more in thickness but capable of providing a precursor having uniform surface without cracking.

Poor: providing a precursor with cracking or having ununiform surface with roughness.

(Average Thickness)

The thickness of the sheet-shaped article was measured at five arbitrary points using a digital thickness gauge ("SMD- 54052", manufactured by TECLOCK), and the mean thereof was taken as the average thickness.

It can be said that when the average thickness is 500 to 700 μm, the fabricability is excellent.

(Surface State)

The surface state of a sheet-shaped article is a measure for determining whether the reactants in the resin composition keep an appropriate viscosity at the start of the curing reaction.

If the reactants do not keep an appropriate viscosity at the start of the curing reaction, the resin composition and the heat-conductive inorganic filler are likely to separate from each other, and it is thus difficult to obtain a homogeneous sheet-shaped article. Then, particularly, a sheet-shaped article to be obtained will have cavities or cracks in edges thereof, and it is difficult to use such a sheet-shaped article as a heat-conductive sheet.

The evaluation was made through visual observation of the surface of the sheet-shaped article obtained. The evaluation criteria are as follows.

Excellent: the whole surface is uniform without cavities or cracks.

Good: a cavity or crack is found within a 3-mm edge, but the rest of the surface is uniform.

Fair: a cavity or crack is found within a 10-mm edge, but the rest of the surface is uniform.

Poor: a cavity or crack is also found in a part far from 10 mm or more from an edge (near the center).

(Difference in Ash Concentration)

Unevenness of ash concentration in the sheet-shaped article is a measure of the dispersibility of the heat-conductive inorganic filler. A large difference in ash concentration between the center and the edge of a sheet-shaped article will lead to unevenness of heat conductivity in the sheet-shaped article.

Evaluation was carried out by the following manner: a sample from the center and that from an edge of a sheet-shaped article were heated from room temperature to 800° C. in air at a rate of temperature increase of 10° C./min in a differential thermogravimetric analyzer (TG-DTA; "TG8120", manufactured by Rigaku Corporation), and the weight loss [%] was measured. Evaluation was made taking into consideration that the difference in the weight loss between the center and the edge corresponds the difference in the ash concentration between them. The evaluation criteria are as follows.

Excellent: the difference in the weight loss is less than 1%.

Good: the difference in the weight loss is 1% or more and less than 1.5%.

Fair: the difference in the weight loss is 1.5% or more and less than 2%.

Poor: the difference in the weight loss is 2% or more.

(Hardness)

The hardness of the sheet-shaped article is a measure of flexibility.

A larger value of the hardness determined through the hardness test of type C according to JIS K 7312:1996 indicates being harder. It can be said that when the hardness is 95 or less, the sheet-shaped article has sufficient flexibility as a heat-conductive sheet.

Sheet-shaped articles were stacked to 20 mm or more in thickness (about 20 mm) to provide a sample, and the determination was carried out on the sample using an ASKER type C durometer ("ASKER Rubber Hardness Tester, Type C", manufactured by KOBUNSHI KEIKI CO., LTD.).

In Comparative Example 11, the sample was too hard to determine, and the result was shown as "-" in Table 3.

(Tackiness)

The tackiness of the sheet-shaped article is a measure for determining whether the heat-conductive sheet is likely to cause a slip between a heating element and a radiator adjacent to thereto.

Small tackiness will lead to insufficient adhesion of the heat-conductive sheet to a heating element and a radiator when using the heat-conductive sheet, and it is therefore difficult to exhibit sufficient heat conductivity.

Evaluation was carried out by the following method. It can be said that the tackiness is good when the found value according to this method is 1.5 N or more.

A sheet-shaped article was placed on an aluminium plate having a size of 150 mm×150 mm×3 mm thickness at a temperature of 25° C., and an aluminium heat sink 15 mm square (which was provided with a holder made of a wire on its side) was placed thereon. A mechanical force gauge ("FB-20N", manufactured by IMADA CO., LTD.) was pressed down against the heat sink at a force of 20 N for 10 seconds. Then, the holder was pulled, and the force necessary to pulling off the heat sink was determined.

(Heat Conductivity)

The heat conductivity is represented by a product of the density, the specific heat capacity, and the thermal diffusivity of a sample. It can be said that the sample has sufficient heat conductivity when the heat conductivity is 3.0 W/(m·K) or more.

The density, the specific heat capacity, and the thermal diffusivity were each determined by the method described below.

<Density>

The sheet-shaped article was punched using a punch provided with a cutting edge with a diameter of 9 mm. The thickness and weight of the resulting sample was measured, and the density was calculated therefrom.

<Thermal Diffusivity>

The thermal diffusivity was evaluated according to the laser flash method. The measurement conditions were as follows.

Measuring apparatus: "LFA447NanoFlash®", manufactured by Netzsch

Sample: 10 mm×10 mm

Sample holder: NanoFlash10.0sq

Measurement model: single layer

Measuring temperature: 25.0±1.0° C.

Number of shots per measuring point: three

Modulation of pulse duration: middle

Measuring time: 1000 ms

Fitting of temperature increasing curve and analytical model: Cowan+pulse correction <Specific Heat Capacity>

The specific heat capacity was determined using a differential scanning calorimetry (DSC; "Thermo Plus DSC8230", manufactured by Rigaku Corporation) with α-alumina as a reference material.

(Heat-Aging Resistance)

Heat-aging resistance of a sheet-shaped article was evaluated on the basis of the retention rate of the heat conductivity and the upper temperature limit of the rubber elastic region thereof after treatment at 150° C. for 1000 hours in a Geer's aging oven ("TG-100", manufactured by Suga Test Instruments Co., Ltd.). It can be said that heat-aging resistance is excellent when the treatment results in a high retention rate of the heat conductivity and does not change the upper temperature limit of the rubber elastic region.

<Retention Rate of Heat Conductivity>

The heat conductivity of a sample after the treatment was determined according to the measurement method described above, and the ratio thereof to the heat conductivity of the untreated sample was taken as the retention rate of the heat conductivity.

<Upper Temperature Limit of Rubber Elastic Region>

The storage modulus of a sample before and after the treatment was measured and the upper temperature limit of rubber elastic region was determined therefrom. The measurement conditions were as follows.

Measuring apparatus: thermomechanical analyzer ("TMA/SS6100", manufactured by Seiko Instruments Inc.)
Frequency: 0.1 Hz
Oscillation: 1.0 mN
Temperature: 25° C. to 350° C.
Rate of temperature increase: 10° C./min
The evaluation criteria are as follows.
Good: the treatment does not change the upper temperature limit of the rubber elastic region, or decreases it by less than 5° C.
Fair: the treatment decreases the upper temperature limit of the rubber elastic region by 5° C. or more and less than 20° C.
Poor: the treatment decreases the upper temperature limit of the rubber elastic region by 20° C. or more.

(Hydrothermal Resistance)

Hydrothermal resistance of a sheet-shaped article was evaluated on the basis of the retention rate of the heat conductivity and the upper temperature limit of the rubber elastic region thereof after treatment at 80° C. and 95% RH for 1000 hours in a thermo-humidistatic chamber ("PH-2KT-E", manufactured by ESPEC CORP.). It can be said that hydrothermal resistance is excellent when the treatment results in a high retention rate of the heat conductivity and does not change the upper temperature limit of the rubber elastic region.

The retention rate of the heat conductivity and the upper temperature limit of the rubber elastic region were determined in the same manner as for the evaluation of heat-aging resistance.

(Thermal Shock Resistance)

Thermal shock resistance of a sheet-shaped article was evaluated on the basis of the retention rate of the heat conductivity and the upper temperature limit of the rubber elastic region thereof after 1000-cycle treatment in which one cycle involved temperature increase/decrease between −30° C. and 100° C. over 1 hour in a thermal shock tester ("TSA-71S", manufactured by ESPEC CORP.). It can be said that thermal shock resistance is excellent when the treatment results in a high retention rate of the heat conductivity and does not change the upper temperature limit of the rubber elastic region.

The retention rate of the heat conductivity and the upper temperature limit of the rubber elastic region were determined in the same manner as for the evaluation of heat-aging resistance.

TABLE 3

| Sheet-shaped article | | Example 8 | Example 9 | Example 10 | Example 11 | Example 12 | Example 13 | Example 14 | Comparative Example 8 | Comparative Example 9 | Comparative Example 10 | Comparative Example 11 | Comparative Example 12 | Comparative Example 13 |
|---|---|---|---|---|---|---|---|---|---|---|---|---|---|---|
| | | Example 1 | Example 2 | Example 3 | Example 4 | Example 5 | Example 6 | Example 7 | Comparative Example 1 | Comparative Example 2 | Comparative Example 3 | Comparative Example 4 | Comparative Example 5 | Comparative Example 6 |
| Resin composition in form of solution | Amount of solution [g] | 2.84 | 2.84 | 2.80 | 2.85 | 2.84 | 2.85 | 2.85 | 2.86 | 2.83 | 2.86 | 2.76 | 2.84 | 2.84 |
| | Solid content [mass %] | 43.5 | 43.4 | 44.2 | 43.3 | 43.5 | 43.4 | 43.4 | 43.2 | 43.7 | 43.3 | 44.8 | 43.6 | 43.6 |
| | Solid [g] | 1.24 | 1.24 | 1.24 | 1.24 | 1.24 | 1.24 | 1.24 | 1.24 | 1.24 | 1.24 | 1.24 | 1.24 | 1.24 |
| Heat-conductive inorganic filler [g] | | F1 10.00 | F1 10.00 | F1 10.00 | F1 10.00 | F1 10.00 | F2 10.00 | F3 10.00 | F1 10.00 | F1 10.00 | F1 10.00 | F1 10.00 | F1 10.00 | F1 10.00 |
| Solid content of mixed composition [mass %] | | 87.5 | 87.5 | 87.8 | 87.4 | 87.5 | 87.5 | 87.5 | 87.4 | 87.6 | 87.4 | 88.1 | 87.5 | 87.5 |
| Ductility in kneading | | Excellent | Excellent | Good | Excellent | Good | Excellent | Good | Fair | Excellent | Excellent | Poor | Excellent | Excellent |
| Average thickness [μm] | | 530 | 620 | 580 | 550 | 600 | 500 | 650 | 750 | 500 | 500 | 800 | 510 | 500 |
| Surface state | | Excellent | Excellent | Excellent | Good | Good | Excellent | Good | Poor | Fair | Fair | Poor | Excellent | Excellent |
| Difference in ash concentration | | Excellent | Excellent | Good | Good | Good | Excellent | Good | Poor | Fair | Poor | Poor | Good | Good |
| Hardness | | 85 | 82 | 90 | 85 | 90 | 80 | 90 | 78 | 96 | 75 | — | 82 | 83 |
| Tackiness [N] | | 4.5 | 4.5 | 2.0 | 5.0 | 1.5 | 7.0 | 1.5 | 7.5 | 1.0 | 3.0 | 0 | 5.0 | 3.5 |
| Heat conductivity [W/(m · K)] | | 3.7 | 3.5 | 3.5 | 3.5 | 3.5 | 3.0 | 4.2 | 2.5 | 3.0 | 3.5 | 2.8 | 3.5 | 3.6 |
| Heat-aging resistance | Retention rate of heat conductivity [%] | 100 | 100 | 100 | 100 | 100 | 100 | 100 | 80 | 100 | 80 | 100 | 98 | 46 |
| | Upper temperature limit of rubber elastic region | Good | Good | Good | Good | Good | Good | Good | Fair | Good | Fair | Good | Fair | Poor |
| Hydrothermal resistance | Retention rate of heat conductivity [%] | 100 | 100 | 100 | 100 | 100 | 100 | 100 | 80 | 100 | 80 | 90 | 50 | 95 |
| | Upper temperature limit of rubber elastic region | Good | Good | Good | Good | Good | Good | Good | Fair | Good | Fair | Good | Poor | Good |
| Thermal shock resistance | Retention rate of heat conductivity [%] | 100 | 100 | 100 | 100 | 100 | 100 | 100 | 80 | 100 | 80 | 80 | 100 | 100 |
| | Upper temperature limit of rubber elastic region | Good | Good | Good | Good | Good | Good | Good | Fair | Good | Fair | Fair | Good | Good |

As seen from the results shown in Table 3, it can be said that the sheet-shaped articles according to Examples 8 to 14 are almost uniform with a good surface state while ductility of the resin composition when kneaded is excellent, and also that these sheet-shaped articles have heat conductivity, flexibility, and tackiness sufficient for a heat-conductive sheet. These sheet-shaped articles also have excellent heat resistance, hydrothermal resistance, and thermal shock resistance, which represent durability.

The invention claimed is:

1. A heat-conductive flexible sheet being a resin sheet formed of a cured product of a mixed composition comprising a resin composition and a heat-conductive inorganic filler, the heat-conductive flexible sheet having a hardness of 95 or less as determined through the hardness test of type C according to JIS K 7312:1996;

wherein the resin composition comprises a blocked urethane prepolymer, an epoxy compound, and a curing catalyst, the blocked urethane prepolymer being a reaction product of an aliphatic diisocyanate compound and a hydrogenated polybutadiene polyol having a hydroxy group at each of both ends, wherein the reaction product has at an end thereof an isocyanate group blocked with an aromatic hydroxy compound, and an amount of a structural unit derived from the aliphatic diisocyanate compound is 1.6 to 2.8 mole per mole of a structural unit derived from the hydrogenated polybutadiene polyol in the reaction product, the epoxy compound having 2 to 6 epoxy groups, wherein an amount of the epoxy group is 0.9 to 2.5 mole per mole of the hydroxy group of the aromatic hydroxy compound, and wherein the amount of the resin composition blended is 5 to 25 parts by mass per 100 parts by mass of the total mass of the heat-conductive inorganic filler.

2. The heat-conductive flexible sheet according to claim 1, wherein the heat-conductive inorganic filler is surface-treated with an aluminum chelate compound.

* * * * *